United States Patent
Havens et al.

(10) Patent No.: US 7,987,979 B2
(45) Date of Patent: Aug. 2, 2011

(54) DATA COLLECTION DEVICE ENCLOSURE

(75) Inventors: William H. Havens, Syracuse, NY (US);
Robert J. Hennick, Cayuga, NY (US)

(73) Assignee: Hand Held Products, Inc., Skaneateles Falls, NY (US)

( * ) Notice: Subject to any disclaimer, the term of this patent is extended or adjusted under 35 U.S.C. 154(b) by 920 days.

(21) Appl. No.: 11/809,265

(22) Filed: May 31, 2007

(65) Prior Publication Data
US 2008/0295932 A1    Dec. 4, 2008

(51) Int. Cl.
*B65D 85/00*    (2006.01)
(52) U.S. Cl. ......... 206/320; 206/305; 150/161; 150/165
(58) Field of Classification Search .................. 206/305, 206/320, 363, 576; 150/154, 161, 165; 220/495.11, 220/495.08, 495.06; 383/2, 80; 53/414, 53/585, 480; 215/230
See application file for complete search history.

(56) References Cited

U.S. PATENT DOCUMENTS

| | | | | |
|---|---|---|---|---|
| 1,752,504 A * | 4/1930 | Penrose | ......................... | 206/772 |
| 2,034,809 A * | 3/1936 | Grant | ........................... | 206/303 |
| 3,254,793 A | 6/1966 | Palmer | ............................. | 221/63 |
| 3,290,856 A * | 12/1966 | Rumberger | ..................... | 53/471 |
| 3,900,021 A * | 8/1975 | Makepeace et al. | .......... | 600/112 |
| 4,522,196 A * | 6/1985 | Cunningham et al. | ........ | 600/112 |
| 4,561,540 A * | 12/1985 | Hunter et al. | ................. | 209/305 |
| 4,901,852 A * | 2/1990 | King | ............................. | 206/320 |
| 5,019,096 A | 5/1991 | Fox, Jr. et al. | | |
| 5,133,090 A | 7/1992 | Modak et al. | | |
| 5,433,221 A * | 7/1995 | Adair | ............................. | 128/849 |
| 5,490,524 A * | 2/1996 | Williams et al. | .............. | 128/849 |
| 5,499,713 A | 3/1996 | Huffer | | |
| 5,591,119 A * | 1/1997 | Adair | ............................. | 600/112 |
| 5,616,338 A | 4/1997 | Fox, Jr. et al. | | |
| 5,812,188 A * | 9/1998 | Adair | ............................. | 348/77 |
| 5,938,586 A * | 8/1999 | Wilk et al. | ..................... | 600/123 |
| 6,082,535 A * | 7/2000 | Mitchell | ........................ | 206/320 |
| 6,167,884 B1 * | 1/2001 | Navis | ............................ | 128/849 |
| 6,601,768 B2 | 8/2003 | McCall et al. | | |
| 6,817,470 B1 | 11/2004 | Goldberg | | |
| 7,011,213 B2 * | 3/2006 | Clark et al. | .................... | 206/438 |
| 7,147,105 B2 * | 12/2006 | Gammons | ...................... | 206/320 |
| 7,147,162 B2 | 12/2006 | Fitch et al. | | |
| 7,151,139 B2 | 12/2006 | Tiller et al. | | |
| 7,159,783 B2 | 1/2007 | Walczyk et al. | | |
| 2002/0125322 A1 | 9/2002 | McCall et al. | | |
| 2003/0111366 A1 | 6/2003 | Enners | | |
| 2003/0213847 A1 | 11/2003 | McCall et al. | | |
| 2004/0234604 A1 | 11/2004 | Mecking et al. | | |

OTHER PUBLICATIONS

"Thermoforming," Machine Design, Aug. 5, 1999, pp. 82 and 84, http://www.machinedesign.com.
"Safety Sleeve", West MDM Medical Design & Manufacturing 2004, Jan. 2004, p. 27.

(Continued)

*Primary Examiner* — David T Fidei
(74) *Attorney, Agent, or Firm* — Heslin Rothenberg Farley & Mesiti P.C.

(57) ABSTRACT

An enclosure for housing a portable data transfer device, such as a bar code scanner, data collection device, or other equipment, for use in environments requiring a certain level of cleanliness, for protection against transmission of infection or merely dust or dirt, while allowing a full range of functional capability of such devices and equipment.

29 Claims, 6 Drawing Sheets

OTHER PUBLICATIONS

Patent Cooperation Treaty, Iinternational Searching Authority, Notification of Transmittal of the International Search Report and the Written Opinion of the International Searching Authority, or the Declaration. Form PCT/ISA/220, dated Dec. 12, 2008, 3 pgs.

Patent Cooperation Treaty, International Search Report, Form PCT/ISA/210, dated Dec. 12, 2008, 3 pgs.

International Searching Authority, Written Opinion of the International Searching Authority, dated Dec. 12, 2008, 5 pgs.

* cited by examiner

DATA COLLECTION DEVICE ENCLOSURE

BACKGROUND OF THE INVENTION

1. Field of the Invention

The invention relates to the field of imaging devices and data collection devices, particularly image and signal generated data collection devices, as well as to data transfer devices in general. More particularly, the invention is directed to protective enclosures for housing such devices during use, particularly for use in clean or sterile environments.

2. Description of Background and Other Information

Data collection devices, particularly bar code scanners and portable data terminals, are being used in an increasing variety of environments. In many of these environments, such as laboratories, hospitals, food processing areas, and so on, cleanliness and contamination of such devices can be of concern.

For example, in the medical environment, such technology can be used for identification of equipment, patients, and medications, etc., so that, for instance, inventories can be monitored, medications can be timely and appropriately distributed and administered, and so forth. Such technology requires the use of various types of imaging and data collection devices, particularly image signal generating data collection/transfer devices.

Among such devices, whether in the medical field or in other fields, are bar code scanners, optical character recognition (OCR) readers, portable data terminals, personal data assistants, transaction terminals, video cameras, digital cameras, cellular telephones, and medical viewing instruments. Such devices, if used in health-related environments, or other such environments in which transmission of infections or diseases, whether air-borne or via contact, is risked by either patients or facility personnel, must remain clean and sterile.

One means of ensuring cleanliness, or a sterilized environment, can be to wipe equipment with compositions for cleaning and/or disinfecting such devices. Such treatment—employed, for example, in hospitals—can be effective in preventing the spread of infections or disease among patients. However, solvents that are normally used in disinfectants have a tendency to attack the plastic from which various equipment is made, such as the housings of such equipment, as well as obscuring keypad symbols and display windows.

A possible solution to such a problem might be the use of all metal device components, including metal housings. Yet further, the device components—whether of plastic, or metal, or even if both plastic and metal components are employed—could be provided with a suitable protective plating or coating, to serve as a barrier preventing cleaning/disinfecting solutions from contacting the underlying surfaces.

For example, component parts might be provided with a copper plating; in such instance, a second plating, such as of nickel or chrome, could be applied over the copper layer—to prevent oxidation of the copper, and to improve the device cosmetics. Such plating or platings could be employed, for instance, with plastic, and particularly thermoplastic (e.g., acrylonitrile butadiene styrene (ABS)) components.

As to coatings, one option could be to apply a nylon or epoxy powder coating to device components. Coatings of these types could be applied electrostatically, and could be added as additional protection over copper-plated components.

Another suitable coating could be polyurethane, which could be applied by spraying, or other means. A commercially available polyurethane coating that could be employed is Clearcoat, from Bayer MaterialScience LLC, Pittsburgh, Pa.

However, even if the components and graphics are successfully shielded from attack, a problem with known cleaning/sterilizing regimes is that data collection devices are not constructed so that they can be easily or thoroughly cleaned and sterilized. Because of such equipment including a variety of surfaces and contours, as well as movable control mechanisms, wiping the equipment with disinfectants can result in an inefficient and/or incomplete cleaning or sterilizing. Further, data collection devices have many surfaces with crevices, creases, and other areas for which cleaning and sterilization can be time-consuming and difficult to be done easily and thoroughly. The spacing of keypad keys, and the movability of keys and triggers, present particular problems in this regard.

This concern might be addressed, at least to an extent, by means for rendering the device components biocidal, against bacteria and other microorganisms. One such means is treatment of the components with appropriate antimicrobial compositions.

Silver aluminosilicate is an antimicrobial inorganic compound, and could be useful as an active ingredient in coatings for data collection device components. This compound is commercially available as Agion® antimicrobial, from Agion Technologies, Inc., Wakefield, Mass. Powder coatings incorporating Agion antimicrobial are commercially available as ALESTA® AM powder coatings, from DuPont Powder Coatings, USA.

U.S. Pat. No. 7,151,139 discloses poly(vinyl-N-pyridinium halide) polymers for biocidal surface coatings.

U.S. Publication No. 2004/0234604, and U.S. Pat. Nos. 5,019,096, 5,133,090, and 5,616,338, disclose further specified antimicrobial agents for coating, incorporating into, or otherwise treating articles.

In hospital environments it is known to maintain medical and surgical implements clean and sterile by means of disposable covers intended for single use procedures. An example is a barrier sleeve manufactured by Tadco Inc., Farmington, N.M., a manufacturer of specialty medical products, including a barrier sleeve for covering a laryngoscope, which is inserted into a patient's throat to examine the larynx or to keep the patient's airway open. The sleeve, made of a biocompatible polyurethane, is used as a single-use safety and hygienic measure as an alternative to sterilizing the blade portion of the instrument between uses.

Concerns typified by the Tadco sleeve relate to the transmission of disease or infection caused by medical devices that come into direct contact with body surfaces. This contrasts with the concerns of the present invention, which relate to protection of a patient or medical personnel, in health-related environments, or persons in other environments requiring sanitary or sterile conditions, from exposure to instruments such as wireless data transmission/collection devices, for which a simple cover would interfere with their operation.

Equipment such as a bar code scanner, for example, include imaging modules for which light is required to be transmitted through an optic window, which light must not be blocked or even distorted by means of a cover. In addition to the sensitivity of an optic window, such equipment typically include a trigger, as well as various buttons and controls for which a cover would tend to provide interference.

Therefore, for equipment such as imaging devices and data collection devices, a need exists for enjoying the advantages that could be gained by providing a feasible enclosure providing single-use capability to ensure safety and hygiene in environments, while allowing the full range of functional capability of such equipment.

SUMMARY OF THE INVENTION

In view of the foregoing problems and concerns, the invention is directed to an enclosure for housing a portable data transfer device, such as a data collection device—particularly a bar code scanner, or a portable data terminal—or other equipment, during use of such device/equipment. The enclosure of the invention can be removed and discarded after such use, yet allows a full range of functional capability of such device/equipment.

Further, the invention relates to an enclosure, for a data collection device, and particularly for a portable data transfer device, which is constructed and adapted to allow the equipment to be protected against transmission of contaminants, whether infectious or merely dust or dirt, while allowing a full functional capability of the equipment, or at least as full a functional capability as is possible. Among such functions are data transferal functions. Moreover, among such functions are those functions, including data transferal functions, that require the non-distortion of light being received by imaging optics. More particularly, the enclosure of the invention can provide an optical quality portion of the enclosure, or an optical quality component of the enclosure.

In an exemplifying example, one concern addressed by the invention is the potential degradation by a protective cover for a bar code scanner of the light received during an attempt to scan a targeted bar code. More broadly, imaging modules for which the enclosure of the invention is to be compatible are those for imaging devices and data collection devices, such as image signal generating data collection devices, including bar code scanners, optical character recognition (OCR) readers, portable data terminals, personal data assistants, transaction terminals, video cameras, digital cameras, cellular phones, and medical viewing instruments.

To implement the invention, a protective disposable enclosure, having an open configuration and a closed configuration, is provided for a data collection device, such as a data imaging device, and particularly a wireless data imaging device. The data collection device for which the enclosure of the invention is provided includes at least a hand-held portion and a data transferal portion. The data transferal portion, of a data collection device, is understood as being the residence of at least one data transferal component, of the device, that participates in the performance of at least one data transferal function.

Data transferal components are understood as including imaging modules, laser diodes, and displays, such as LCD and LED displays. Data transferal functions are understood as including operation of an imaging module, scanning effected by utilization of a laser diode, wireless and infrared communications, and operation of the display in transmitting data—e.g., presenting information, or providing instructions—to the user of the device. Further, data transferal functions are understood as including the following: transmitting data from the device; receiving data to the device; displaying information to the user of the device; and displaying instructions to the user of the device.

The enclosure of the invention includes:
(a) a first portion, adapted to enclose the hand-held portion of the device, the first portion of the enclosure adapted to be held by a user during use of the device; and
(b) a second portion, adapted to enclose the data transferal portion of the device.

The second portion, of the enclosure of the invention, is constructed and arranged to permit performance of at least one of the data transferal functions that the device is adapted to provide. Particularly, the second portion, of the enclosure of the invention, is constructed and arranged to permit performance of at least a majority of the data transferal functions that the device is adapted to provide. More particularly, the second portion, of the enclosure of the invention, is constructed and arranged to permit performance of substantially all, or all, of the data transferal functions that the device is adapted to provide.

In an embodiment, the data collection device for which the enclosure of the invention is provided comprises a data imaging device, with the data transferal portion of the dice comprising an imaging portion. For this embodiment, the second portion of the enclosure is constructed and arranged for transmission of light to the imaging portion of the imaging device, the second portion including a region having an optical quality enabling the imaging device to capture and manipulate images from light transmitted through the second portion of the enclosure. Particularly, the region of the second portion of the enclosure can be constructed and arranged to enable the imaging device to capture and manipulate images from light transmitted through the second portion of the enclosure as efficiently, or substantially as efficiently, whether housed in the enclosure or not housed in the enclosure.

In a particular embodiment, the first and second portions of the enclosure are constructed as a one-piece part, which can be manufactured by thermoforming.

In an alternative embodiment, the first and second portions of the enclosure are made as an at least two-piece construction. In such an embodiment, the second portion can comprise an optical quality component over-molded to a remainder of the enclosure.

More particularly, according to an alternative embodiment, the second portion of the enclosure is constructed as an end cap having an optical quality window, whereby, in the closed configuration of the enclosure, the optical quality window is positioned for alignment with the imaging portion of the imaging device for transmission of imaging light through the window to the imaging portion of the imaging device.

According to a further aspect of an alternative embodiment, the first portion of the enclosure comprises a shapeless cover that encloses at least a part of the first portion of the enclosure. In such an embodiment, the second portion can comprise a rigid end cap which has an optical quality window that is either glued, over-molded, or otherwise secured to the remainder of the end cap. In one embodiment, in the closed configuration of the enclosure, the end cap is secured to the shapeless cover with an O-ring.

According to a further aspect of another alternative embodiment, the first portion of the enclosure comprises a rigid cover to enclose at least a part of the first portion of the enclosure. In such an embodiment, the rigid end cap can be secured to the rigid cover with an O-ring, for example. As with the previously mentioned alternative embodiment, the second portion can comprise a rigid end cap which has an optical quality window that is either glued, over-molded, or otherwise secured to the remainder of the end cap.

According to yet another aspect of an alternative embodiment, the first portion of the enclosure can be comprised of a plurality of parts. In such an embodiment, the plurality of parts of the first portion of the enclosure can be adhesively sealed or mechanically non-adhesively sealed.

BRIEF DESCRIPTION OF THE DRAWINGS

Other characteristics and advantages of the invention can be better understood from the following description, with reference to the annexed drawings showing, by way of non-limiting examples, how the invention can be embodied, and in which.

DESCRIPTION OF THE INVENTION

The following detailed description and accompanying illustrations are directed to exemplary embodiments within the scope of the invention. However, it is to be understood that the particular features, materials, portions, components, and shapes of such portions and components, of the invention, are not limiting except as defined in the claims. Likewise, the particular description presented in the accompanying abstract of the disclosure is not to be taken as limiting of the invention, which is defined in the claims.

FIGS. 1, 2, 3a, and 3b illustrate examples of imaging devices, or optical readers, of the type for which an enclosure according to the invention can be utilized.

Figure 1:
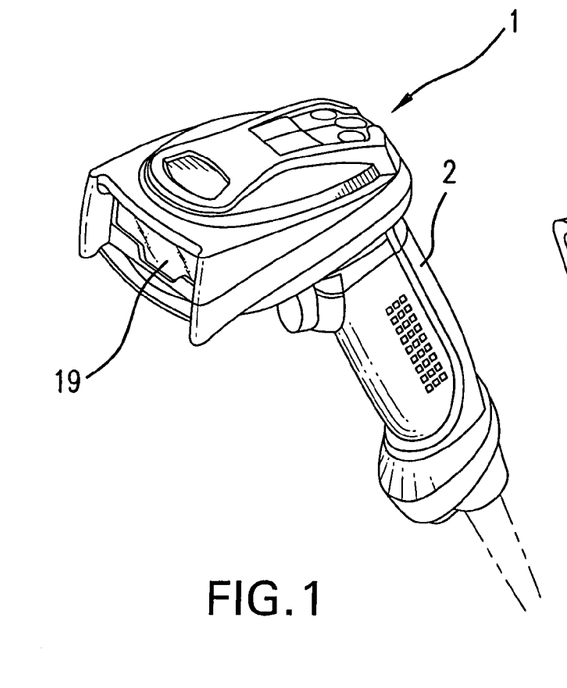
FIG. 1 is a perspective view of a first exemplary imaging device, in the form of a gun-type optical reader, for which an enclosure of the invention is suitable.

FIG. 1 shows a gun style optical reader 1, having a scanning window 19, and an imaging module (not shown) incorporated into the reader housing 2, which reader can be that which is disclosed in U.S. Pat. No. 7,147,162, or in U.S. Pat. No. 7,159,783, or in U.S. Pat. No. 6,601,768; the disclosures of these patents are incorporated herein in their entireties, by reference thereto. Further, the invention can be utilized for optical imagers manufactured by Hand Held Products, Inc., of Skaneateles Falls, N.Y., such as a gun style optical reader like those of its 3800 family of linear imagers. Although the reader is shown as being corded, the reader according to the invention could be cordless as well.

Figure 2:
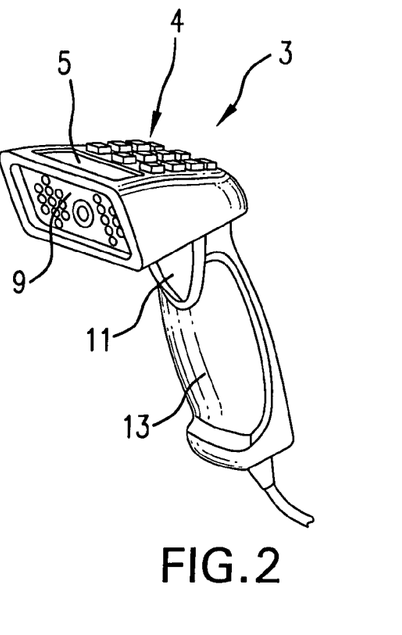
FIG. 2 is a perspective view of a second exemplary imaging device, in the form of a gun-type optical reader having an integrated keyboard and display, for which an enclosure of the invention is suitable.

FIG. 2 shows another exemplary embodiment of a gun-style reader 3, which includes an integrated keyboard 4, display 5, trigger 11, imaging module 9, and housing 13. As with the reader of FIG. 1, the reader 3 can be corded or cordless.

Figure 3A:
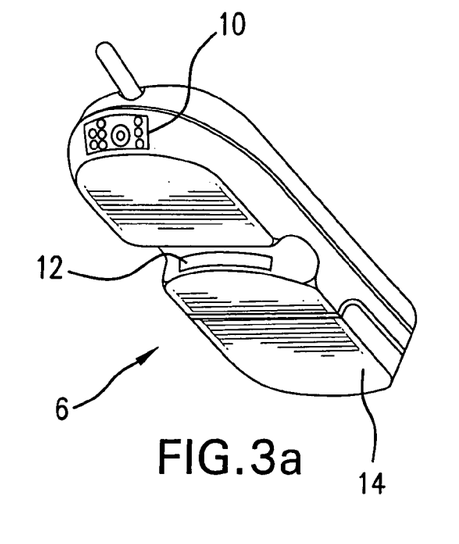
FIG. 3a is a perspective view of a third exemplary imaging device, in the form of a portable data terminal (PDT) style reader.
Figure 3B:
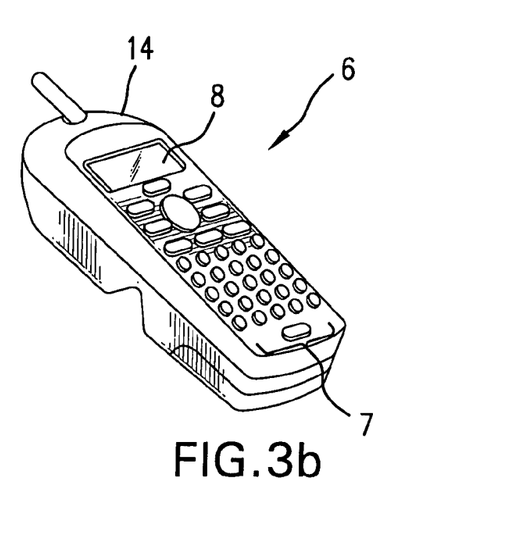
FIG. 3b is a perspective view of the third exemplary imaging device, which shows a keyboard and display on an upper surface of the device.

FIGS. 3a and 3b illustrate an imaging device in the form of a portable data terminal (PDT) style reader 6 having a keyboard 7, display 8, trigger 12, an imaging module 10, and housing 14, which device can be that which is disclosed in U.S. Pat. No. 6,601,768. Further, any of the 7900 and 9500 family of PDT style imagers of Hand Held Products, Inc. are exemplary of devices for which the enclosure of the invention can be utilized.

Figure 4:
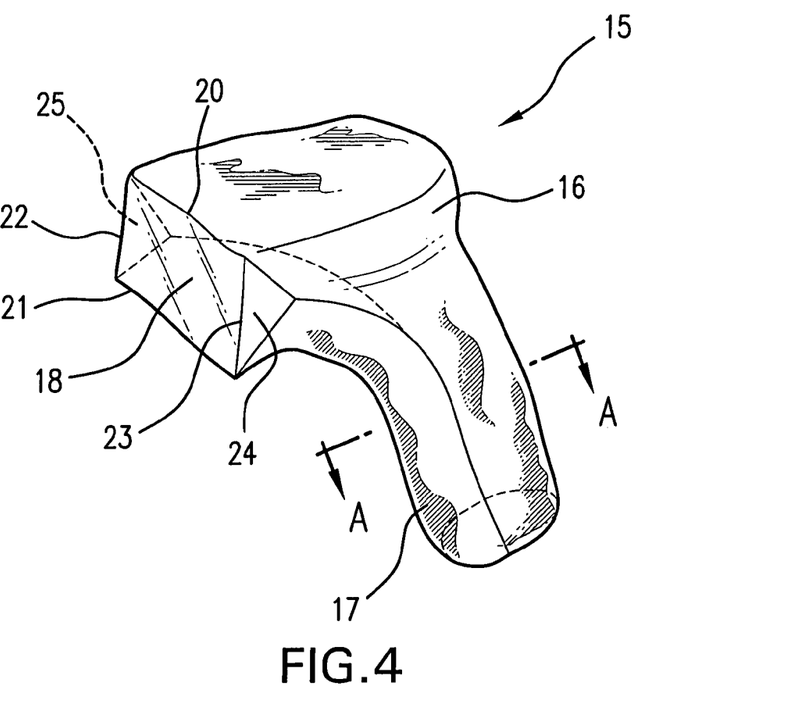
FIG. 4 is A perspective view of an enclosure according to a first embodiment of the invention, in a closed configuration, for housing a device of a type exemplified in FIGS. 1 and 2, although the first embodiment could also house a device of a type exemplified in FIGS. 3a and 3b.

FIG. 4 illustrates an enclosure 15, in a closed configuration, according to a first embodiment of the invention, for housing an imaging device of a type shown in FIGS. 1 and 2. In this embodiment, the enclosure can be made by thermoforming from an extruded thermoplastic sheet which, upon heating, can be drawn into a mold cavity by a vacuum, e.g., so that the heated sheet assumes the shape determined by the contours of the cavity. Thermoforming processes are well-known to those skilled in the art, which procedures can be adapted for manufacturing the subject enclosure and, therefore, further details of such processes, in general, are not herein described.

Suitable nonlimiting materials that can be used within the scope of the invention include ABS, polycarbonate, polystyrene, and PETG (polyethylene terephtalate glycol).

Figure 5:
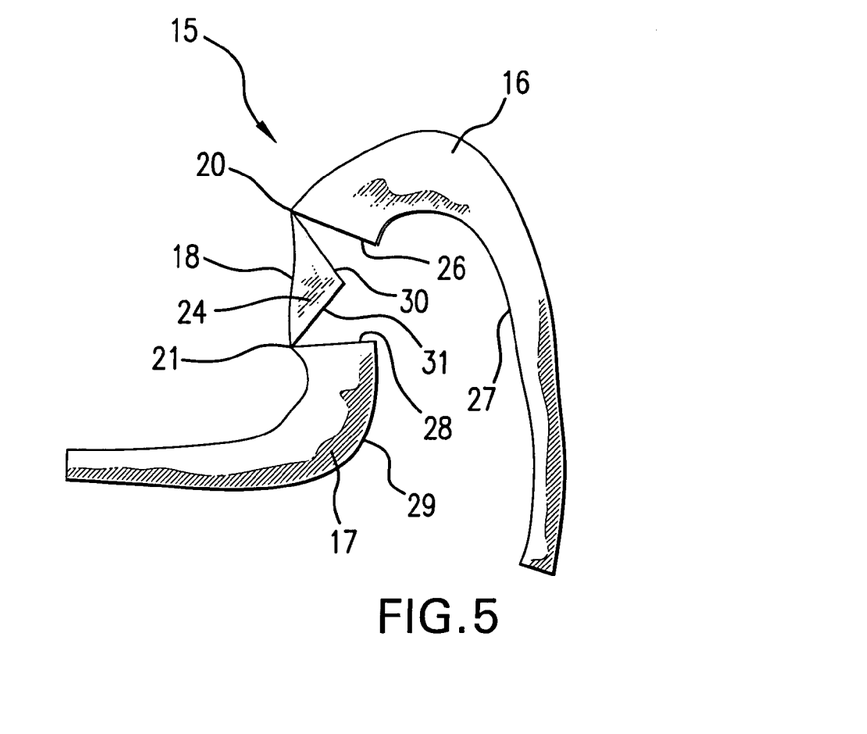
FIG. 5 is a side view of the enclosure of FIG. 4, shown in an open configuration for receiving an imaging device.

The one-piece enclosure of FIG. 4 can be considered a clam-shell, which includes a first part 16 and a second part 17, shown in FIG. 5 in an open configuration, which close upon a window portion 18. Window portion 18 is constructed and arranged for transmission of light to the imaging device, such as to the scanning window 19 of the device of FIG. 1 or to the imaging module 9 of the device of FIG. 2.

The enclosure of FIG. 4 can be regarded as "rigid," inasmuch as, although it can flex upon application of a force during handling, in view of the relative small thickness of its parts, it nevertheless retains its shape. This rigidity is in contrast, e.g., to a so-called "shapeless" bag, exemplified by a common poly trash bag. The thickness of the parts can range from 0.005 inches to 0.010 inches, or from about 0.005 inches to about 0.010 inches.

In closing from the open configuration of FIG. 5 to the closed configuration of FIG. 4, the parts 16 and 17 move about effective hinges 20 and 21. The hinge 20 is the intersecting line between part 16 and window portion 18, and the hinge 21 is the intersecting line between part 17 and window portion 18. The window portion 18 of the enclosure 15 includes edges 22 and 23, shown in FIG. 4, which are merely the intersections of the rectangular front-facing surface of the window portion and opposite triangular portions 24, 25.

As shown in the open configuration of FIG. 5, each of the parts 16, 17 of the enclosure 15 presents complementary edges which are brought together with those of the other of the parts 16, 17 and with edges of the window portion 18. Part 16 includes edges 26, 27; part 17 includes edges 28, 29; and window portion 18 includes edges 30, 31. In the closed configuration of enclosure 15, edge 26 of part 16 mates with edge 30 of window portion 18; edge 27 of part 16 mates with edge 29 of part 17; and edge 28 of part 17 mates with edge 31 of window portion 18.

Figure 6:
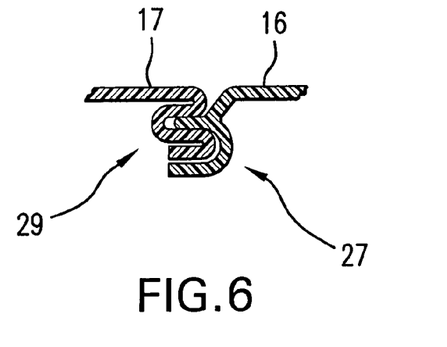
FIG. 6 shows, in cross section, a first implementation detail of mechanically sealed edges of the enclosure of FIG. 4, taken along the line A-A of FIG. 4.
Figure 7A:
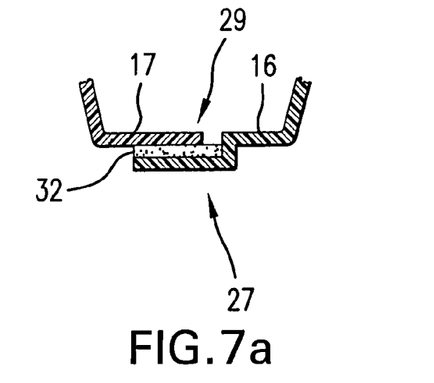
FIG. 7a shows, in cross section, a second implementation detail of adhesively sealed edges of the enclosure of FIG. 4, taken along the line A-A of FIG. 4.
Figure 7B:
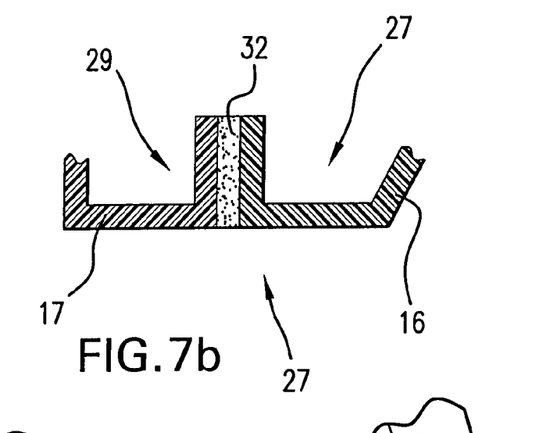
FIG. 7b shows, in cross section—as a variation of the second implementation detail shown in FIG. 7b—a third implementation detail of adhesively sealed edges of the enclosure of FIG. 4, taken along the line A-A of FIG. 4.

For ensuring a seal against manual contact with the housing of the imaging device within the enclosure 15, as well as against infiltration of air-borne contaminants, any of a number of structures can be provided at all of the aforementioned edges of the parts/portions 16, 17, 18 of the enclosure. FIGS. 6, 7a, and 7b, which are partial cross-sectional views taken along line A-A of FIG. 4, show possible non-limiting alternative implementation details.

FIG. 6 illustrates a mechanical seal that can, optionally, also include an adhesive sealing expedient, such as a strip of glue. However, the technique employed in FIG. 6 ensures sealing by means of a mating projection along at least one of the edges 27, 29 and a complementary groove along the other of the edges 27, 29. The projection(s) are mechanically force-fitted within the mating groove as the parts 16, 17 are pressed together, enclosing the optical device (not shown in FIG. 4) within the enclosure 15. In the optional additional adhesive form, the groove(s) can be provided with a line of glue or adhesive, thereby providing a water-tight seal to protect against the ingress of contaminated fluids into the enclosure.

In the alternative implementation detail shown in FIG. 7a, the edges 27, 29 of parts 16, 17, respectively, are overlapped. Between the overlapped edges is a layer of adhesive 32. One side of such layer 32 can be applied, as part of the manufacturing process for the enclosure, onto the surface of one of the edges 27, 29, with a pealable release strip covering the opposite side of the layer 32. At the time of use of the enclosure 15, before the parts 16 and 17 of the clamshell are brought together, the release strip is removed, thereby exposing the aforementioned opposite side of the adhesive layer for adherence to the other of the edges 27, 29 for sealing the enclosure in the closed configuration, shown in FIG. 4.

In the variation of the FIG. 7a implementation as depicted in FIG. 7b, each of edges 27 and 29 is terminated with an upwardly angled end, or flange, so that these ends, or flanges, are facing, or opposed. Further in this variation, adhesive layer 32 is applied to the outer surface of one of the two indicated ends, or flanges—for adherence to the outer surface of the other end, or flange, after removal of the release strip.

Suitable adhesives, for the indicated sealing implementations, include ultraviolet (UV) curable silicone adhesives, and room temperature vulcanizate (RTV) silicone adhesives, as are known. Commercially available such silicone adhesives which can be used include NOVAGARD UV curable Silicones #800-205 and #800-306, from Novagard Solutions, Cleveland, Ohio, and GE silicone #RTV 108, from Momentive Performance materials, Wilton, Conn.

At the site for which the enclosure 15 is to be used, i.e., in a hospital, for example, the enclosure can be an uppermost one of a nested stack of such enclosures, from which stack enclosure 15 can be conveniently removed for use. With the release strip covering the adhesive in the case of the FIG. 7 implementation, the nested enclosures would not stick to one another, thereby facilitating easy removal from a stack of enclosures. After a particular procedure or use of the imaging device while housed in the enclosure 15, the enclosure can be removed and discarded.

To allow for removing the device from closed enclosure 15, the enclosure can be opened by tearing, or by cutting with a suitable implement, such as a scissors or knife. Alternatively, and particularly if enclosure 15 is not adhesively sealed during use, the clamshell halves can be easily separated from the closed configuration for removal of the imaging device. And yet further, even if the enclosure is adhesively sealed, the relative thin-walled halves of the clamshell can be distorted, if necessary, to separate them from one another.

Although the enclosure 15, in this particular embodiment, is made as a one-piece structure by thermoforming, it is to be understood that at least the forward-facing region of the window portion 18 is to be have an optical quality so that light received by the imaging device can be received without distortion or degradation, or without substantial distortion or degradation, so that the full functional capabilities of the imaging device is not hindered by the enclosure. One way to ensure such optical quality of the forward-facing window region of the window portion 18 is to provide for the sufficient polishing of the tooling of the mold against which the window region is formed. In an alternative embodiment, a separate optical quality part can be overmolded to the remainder of the thermoformed piece. Upon removal of the enclosure from the mold, any plastic that covers such overmolded part can be cut away, thereby exposing the window region thusly formed.

In the closed configuration of the enclosure 15, the window portion and, particularly, at least the optical quality region of the window portion, is positioned in alignment with the imaging portion of the imaging device. For example, the window portion/region can be positioned parallel, or substantially parallel, to the window 19 in the FIG. 1 imaging device or to the imaging module 9 in the FIG. 2 imaging device. However, such alignment of the window portion/region can take into account the need for an angle to prevent specular reflection—of light, from of any illumination LEDs of the device—from adversely affecting operation of the imaging device while housed within the enclosure. As a consequence of the proper alignment and optical quality of the window portion/region of the enclosure, an object of the invention is to provide that a scanned image is captured as efficiently and accurately, or substantially as efficiently and accurately, as if the imaging device were not housed in the enclosure.

For the purpose of enclosing an imaging device having a trigger, such as those of FIGS. 1 and 2, for example, the region of part 17, of enclosure 15, that extends over such trigger can be made, during thermoforming, to be thinner than portions of the enclosure which extend over noncontrol surfaces of the imaging device (control surfaces being those of a trigger or other functional parts, such as keys of a keypad). Correspondingly, if the imaging device includes a keypad, such as keypad 4 in FIG. 2, the portion of the enclosure overlying the keypad can be similarly made thinner.

On the other hand, if the imaging device includes an auto-trigger capability, there would be no need for providing a flexible trigger region for the enclosure.

Figure 8:
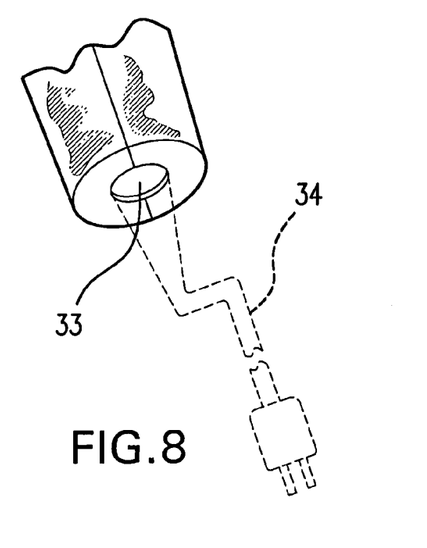
FIG. 8 shows a partial perspective view of a lower end of the enclosure of FIG. 4 having an opening for accommodating a cord of an enclosed imaging device.

FIG. 8, in a perspective view—of the bottom of the enclosure 15 that overlies the handle region of the imaging device, in the closed configuration of the enclosure—shows an opening 33. This opening is for accommodating a cord 34, if the imaging device is thusly equipped. The opening through which the cord extends, in such an implementation, could have an attached additional expedient, such as a thin plastic sheath (not shown) out of which the cord extends. At the lower end of the enclosure, such a sheath can be attached to the enclosure by being sealed thereto with adhesive. Alternatively, the upper end of the sheath could overlap the lower end of the enclosure, and be sealed in place either by adhesive or by an elastic O-ring.

Figure 9:
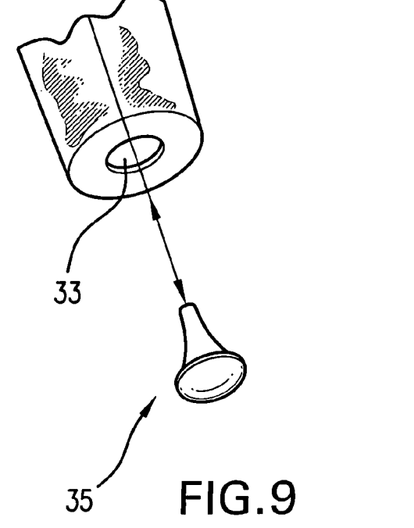
FIG. 9 shows a partial perspective view of a lower end of the enclosure of FIG. 4 having an opening and a plug for sealing the opening for an enclosed cordless imaging device.

FIG. 9, also in a perspective view—of the bottom of the enclosure 15 that overlies the handle region of the imaging device, in the closed configuration of the enclosure—provides for a resilient plug 35. This plug can be formed from a suitable elastomer, such as rubber. It can be pressed in a friction-fit, in opening 33, to seal the opening if the imaging device housed in the enclosure is cordless. Of course, the enclosure 15 can be made without an opening 33, thereby being designed exclusively for a cordless imaging device.

Although the first embodiment, of the enclosure of the invention, has been described above in connection with housing a gun-style optical reader, such an embodiment could be used for housing a PDT type device, such as that of FIGS. 3a and 3b, by providing the enclosure in the appropriate size and shape. Particularly, in the thermoforming process, the mold cavity can be configured to provide an enclosure of the requisite size and shape for housing a PDT type device.

Figure 10:
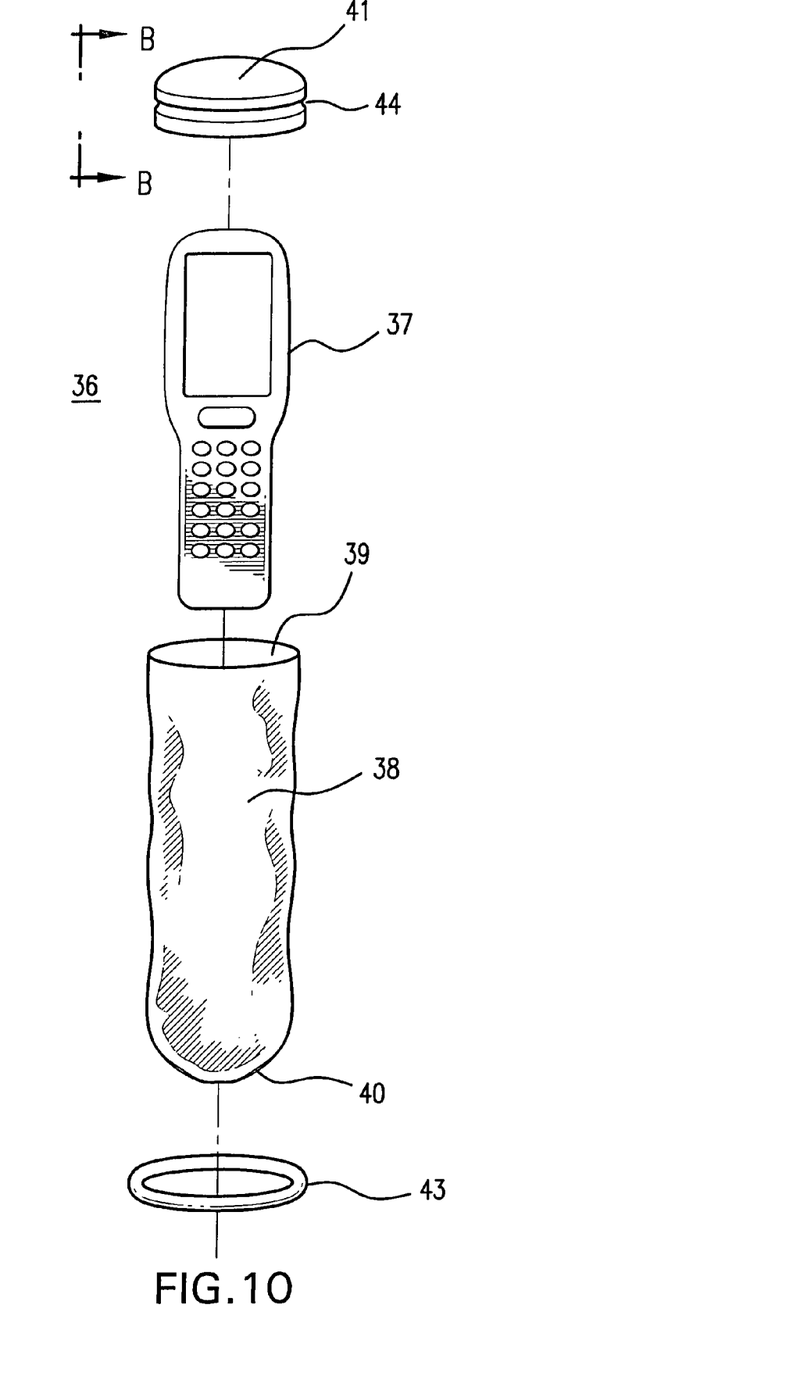
FIG. 10 shows an exploded diagram of a disposable multi-piece enclosure according to a second embodiment of the invention, in an open configuration, for housing a device of a type exemplified in FIGS. 3a and 3b—the imaging device also being depicted in FIG. 10—although the second embodiment could also house a device of a type exemplified in FIGS. 1 and 2.

FIG. 10 illustrates an enclosure 36, in an open configuration, according to a second embodiment of the invention, for housing an imaging device 37 of the PDT type. PDTs suitable for this enclosure include members of the 7900 or 9500 families of PDTs manufactured by Hand Held Products, Inc.

The enclosure of this embodiment comprises a number of parts, which can be considered to form a disposable kit for enclosing an imaging device. These parts include an outer bag 38, having an open upper end 39 and a closed lower end 40, as well as a hard plastic end cap 41.

Outer bag 38 can be a shapeless bag, such as a clear poly bag, and particularly can be a flexible shapeless bag. Alternatively, outer bag 38 can be rigid, in the manner of the enclosure of FIG. 4.

Figure 11:
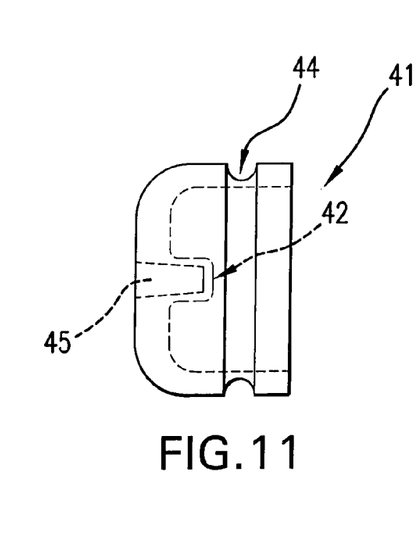
FIG. 11 shows a side view of an end cap of the enclosure of FIG. 10, taken in the direction of line B-B of FIG. 10.
Figure 12:
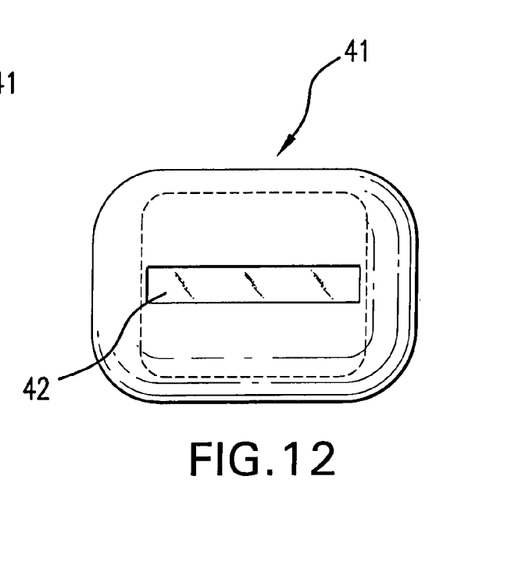
FIG. 12 shows an end view of the end cap of the enclosure of FIG. 10.

The end cap includes an integral molded-in window 42, which window can be formed as part of the manufacture of a two-shot thermoplastic end cap with an overmolded window, formed during an injection mold process. FIG. 11 shows that the window 42 recessed from the end of the end cap at the end of a tunnel 45.

Suitable materials for manufacture of the end cap include ABS and polycarbonate. Such materials, if the end cap is made as a single piece, must be optical quality, so that the window 42 does not distort the light transmitted to the imaging module of the PDT. If the window is a piece made separately from the remainder of the end cap, either by being overmolded or otherwise affixed to the remainder of the end cap, at least the window must be optical quality. In the embodiment of FIG. 10, the enclosure/kit also includes an elastomeric O-ring 43, which may be of rubber.

Figure 13:
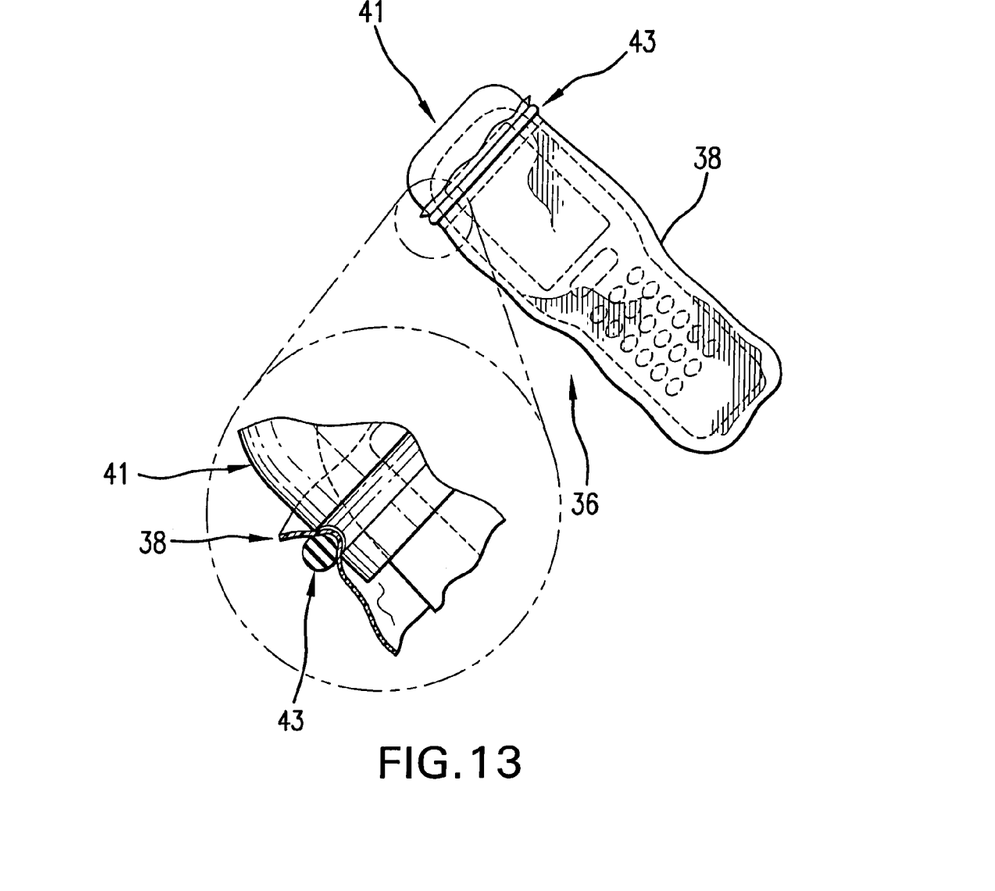
FIG. 13 shows the enclosure of FIG. 10 in a closed configuration, housing an imaging device.

To enclose and seal the imaging device 37 in the closed configuration of the enclosure 36 shown in FIG. 13, the end cap 41 is positioned until seated in the window pocket of the PDT 37—a PDT without a window, in the case of the Hand Held 7900 or 9500 families. The bag 38 is slid onto the PDT 37, from the keyboard end of the PDT, until the bag overlaps the U-shaped groove 44 of the end cap. Then, the O-ring 43 is slid over the bag 38 until it becomes seated in the groove 44. The PDT 37, in the closed configuration of enclosure 36 as shown in FIG. 13, is then sealed against the ingress of chemicals and bacteria, e.g., from contacting the material and orifices of the PDT.

The stylus (not shown) of the PDT would need to be outside the sealed enclosure, and could be part of the disposable kit. Such a kit can be conveniently packaged and zip-locked sealed for easy access by the user.

Although the second embodiment has been described above in connection with housing a PDT type device, such an embodiment could be used for housing a gun-style optical reader, such as those of FIGS. 1 and 2, by providing the bag and the end cap in appropriate size and shape.

In a variation on the above-described second embodiment, rather than having the bag 38 secured to the end cap 41 by means of an O-ring 43, the bag 38 could be permanently sealed to the end cap (which therefore would not necessarily include the O-ring groove 44) by means of adhesive or ultrasonic welding. An enclosure 46 according to this variation is shown in FIGS. 14 and 15.

Figure 14:
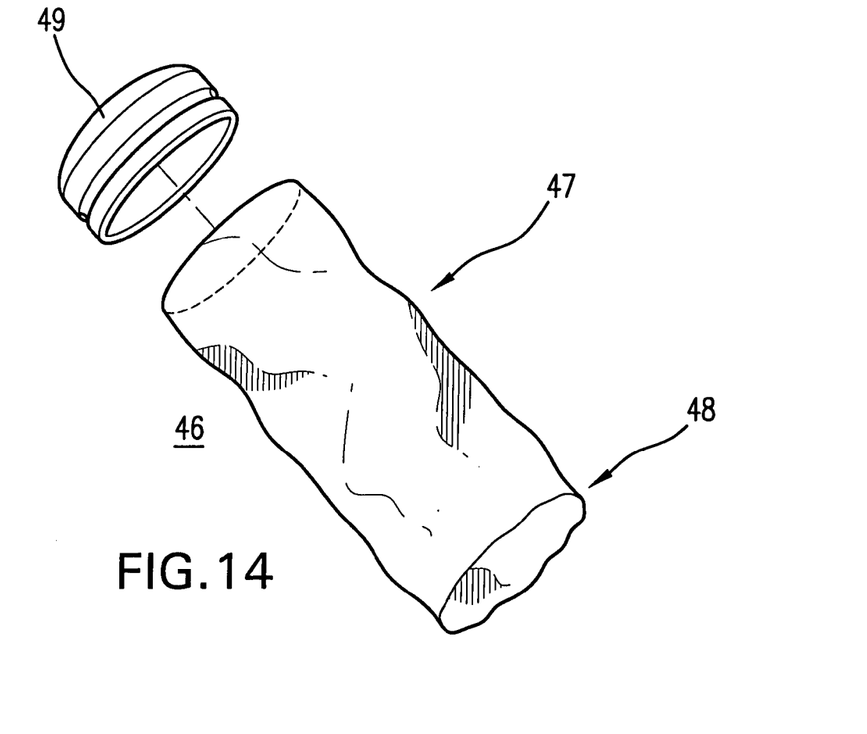
FIG. 14 shows an exploded diagram of a disposable multi-piece enclosure according to a third embodiment of the invention, in an open configuration, for housing a device of a type exemplified in FIGS. 3a and 3b, although the third embodiment could also house a device of a type exemplified in FIGS. 1 and 2.
Figure 15:
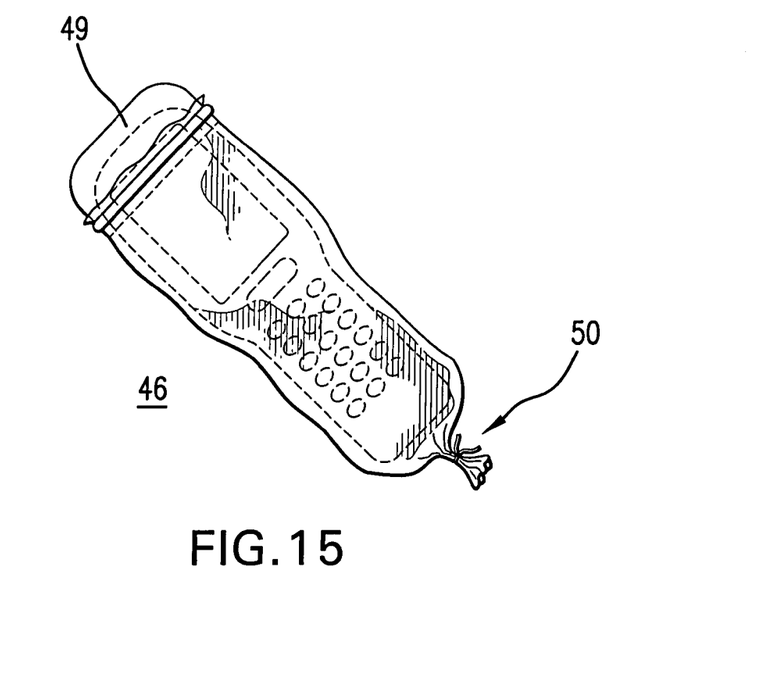
FIG. 15 shows the enclosure of FIG. 14 in a closed configuration, housing an imaging device.

In the embodiment of FIGS. 14 and 15, according to a third embodiment of the invention, the shapeless bag 47 has an open lower end 48, rather than a closed end (such as the closed end of the bag 38 of the previous embodiment). The imaging device, such as the PDT of the previous embodiment, is inserted through the open end 48 and pushed up to mate with the end cap 49 (for which the O-ring groove could be omitted); this end cap is sealed to the bag 47, as mentioned above. After the imaging device is fully inserted into the bag 47, the open end 48 is then closed with a twist tie 50 or other sealing mechanism or suitable sealing expedient.

A variation of the third embodiment includes a longitudinal slit along the length of the bag, providing a longitudinal opening so that the imaging device can be more easily inserted into the bag. Such an embodiment would be advantageous in the event that the bag is more streamlined to the imaging device; this could be the case particularly if the embodiment were adapted for use with a gun-style optical reader. The slit could then be closed by means of the implementation of an adhesive strip, such as an adhesive strip having a pealable release layer, as described above in connection with FIG. 7, whereby mating edges forming the slit could be sealed.

In another variation, the bag could be colored, although a clear bag would allow the user to see the imaging device inside the bag, as well as such features as the good read LED, etc. Another disposable protective enclosure could be a blow-molded rubber skin similar to a rubber glove or a disposable glove used in the food industry.

Although, like the second embodiment, the third embodiment—which includes a flexible shapeless bag 47—has been described above in connection with housing a PDT type device, the third embodiment—like the second embodiment—could be used for housing a gun-style optical reader, such as those of FIGS. 1 and 2, by using an appropriately sized bag and an appropriately sized and shaped end cap.

Finally, although the invention has been described with reference to particular means, materials, and embodiments, it is to be understood that the invention is not limited to the particulars disclosed, and extends to all equivalents within the scope of the claims.

What is claimed is:

1. A protective disposable enclosure for a data collection device that includes at least a hand-held portion and a data transferal portion that includes an imaging portion, said enclosure having an open configuration and a closed configuration, said enclosure comprising:
   (a) a first portion, adapted to enclose the hand-held portion of the device, said first portion of the enclosure adapted to be held by a user during use of the device;
   (b) a second portion, adapted to enclose the data transferal portion of the device, and being constructed and arranged to permit performance of at least a majority of the data transferal functions that the device is adapted to provide;

wherein said second portion is constructed and arranged for transmission of light to said imaging portion, said second portion comprising a region having an optical quality enabling said data collection device to capture and manipulate images from light transmitted through said second portion of the enclosure, wherein the region is provided by an optical quality window, wherein a forming of the optical quality window comprises over molding a second material over a first material.

2. An enclosure according to claim 1, wherein:
said second portion is constructed and arranged to permit performance of substantially all of the data transferal functions that the device is adapted to provide.

3. An enclosure according to claim 1, wherein:
said first portion and said second portion of the enclosure are a one-piece construction.

4. An enclosure according to claim 1, wherein:
said first portion and said second portion of the enclosure comprise at least a two-piece construction.

5. An enclosure according to claim 1, wherein:
said first portion of the enclosure comprises a shapeless cover to enclose at least a part of said first portion of the enclosure.

6. An enclosure according to claim 5, wherein:
said second portion of the enclosure comprises a rigid end cap.

7. An enclosure according to claim 6, wherein:
said rigid end cap is glued to said shapeless cover.

8. An enclosure according to claim 6, wherein:
in said closed configuration of the enclosure, said rigid end cap is secured to said shapeless cover with an O-ring.

9. An enclosure according to claim 1, wherein:
said first portion of the enclosure comprises a plurality of parts; and
in said closed configuration of the enclosure, said plurality of parts are adhesively sealed.

10. An enclosure according to claim 1, wherein:
said first portion of the enclosure comprises a plurality of parts; and
in said closed configuration of the enclosure, said plurality of parts are non-adhesively mechanically sealed.

11. An enclosure according to claim 1, wherein:
said first portion and said second portion of the enclosure are a one-piece construction.

12. An enclosure according to claim 1, wherein:
said first portion and said second portion of the enclosure comprise at least a two-piece construction.

13. An enclosure according to claim 12, wherein:
said second portion of the enclosure comprises an end cap having an optical quality window; and
said optical quality window, in said closed configuration of the enclosure, is positioned for alignment with the imaging portion of the data collection device for transmission of imaging light through said window to the data collection portion of the device.

14. An enclosure according to claim 1, wherein:
said first portion of the enclosure comprises a shapeless cover to enclose at least a part of said first portion of the enclosure.

15. An enclosure according to claim 14, wherein:
said second portion of the enclosure comprises a rigid end cap.

16. An enclosure according to claim 15, wherein:
in said closed configuration of the enclosure, said rigid end cap is secured to said shapeless cover with an O-ring.

17. An enclosure according to claim 1, wherein:
said first portion of the enclosure comprises a rigid cover to enclose at least a part of said first portion of the enclosure.

18. An enclosure according to claim 17, wherein:
said second portion of the enclosure comprises a rigid end cap.

19. An enclosure according to claim 18, wherein:
said rigid end cap is secured to said rigid cover with an O-ring.

20. An enclosure according to claim 1, wherein:
said first portion of the enclosure comprises a plurality of parts; and
in said closed configuration of the enclosure, said plurality of parts are adhesively sealed.

21. An enclosure according to claim 1, wherein:
said first portion of the enclosure comprises a plurality of parts; and
in said closed configuration of the enclosure, said plurality of parts are non-adhesively mechanically sealed.

22. The protective disposable enclosure according to claim 1, wherein the forming of the optical quality window further comprises removing an area of the first material adjacent the over molded second material.

23. A protective disposable enclosure for a data collection device that includes at least a hand-held portion and a data transferal portion that includes an imaging portion, said enclosure having an open configuration and a closed configuration, said enclosure comprising:
(a) a first portion, adapted to enclose the hand-held portion of the device, said first portion of the enclosure adapted to be held by a user during use of the device;
(b) a second portion, adapted to enclose the data transferal portion of the device, and being constructed and arranged to permit performance of at least a majority of the data transferal functions that the device is adapted to provide;
wherein said second portion is constructed and arranged for transmission of light to said imaging portion, said second portion comprising a region having an optical quality enabling said data collection device to capture and manipulate images from light transmitted through said second portion of the enclosure, wherein said second portion of the enclosure comprises a rigid end cap, and wherein said rigid end cap of the second portion includes an optical quality window over molded to the remainder of the end cap.

24. A protective disposable enclosure of claim 23, wherein said first portion of the enclosure comprises a rigid part to enclose at least a part of the first portion of the enclosure.

25. A protective disposable enclosure of claim 24, wherein said rigid end cap is secured to the rigid part.

26. A protective disposable enclosure of claim 24, wherein said rigid end cap is secured to the rigid part with an O-ring.

27. A protective disposable enclosure for a data collection device that includes at least a hand-held portion and a data transferal portion that includes an imaging portion, said enclosure having an open configuration and a closed configuration, said enclosure comprising:
(a) a first portion, adapted to enclose the hand-held portion of the device, said first portion of the enclosure adapted to be held by a user during use of the device;
(b) a second portion, adapted to enclose the data transferal portion of the device, and being constructed and arranged to permit performance of at least a majority of the data transferal functions that the device is adapted to provide;

wherein said second portion is constructed and arranged for transmission of light to said imaging portion, said second portion comprising a region having an optical quality enabling said data collection device to capture and manipulate images from light transmitted through said second portion of the enclosure, wherein said first portion of the enclosure comprises a plurality of parts, wherein said plurality of parts, when said enclosure is in an open configuration, are not joined by adhesive sealing, and wherein said plurality of parts, when said enclosure is in a closed configuration, are joined by adhesive sealing.

28. The protective disposable enclosure according to claim 27, wherein said plurality of parts includes a first part for covering a front of a handle, and a second part for covering a rear of a handle.

29. The protective disposable enclosure according to claim 27, wherein a part of said plurality of parts includes a releasable release strip covering an adhesive layers, the releasable release strip preventing sticking of the protective disposable enclosure with other protective disposable enclosures when stacked with said other protective disposable enclosures.

* * * * *